United States Patent
Matsubara

(10) Patent No.: US 7,701,789 B2
(45) Date of Patent: Apr. 20, 2010

(54) SEMICONDUCTOR DEVICE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 671 days.

(21) Appl. No.: 11/554,259

(22) Filed: Oct. 30, 2006

(65) Prior Publication Data

US 2009/0008640 A1    Jan. 8, 2009

(51) Int. Cl.
    *G11C 29/00*    (2006.01)
(52) U.S. Cl. .................. 365/201; 365/191; 365/189.03; 365/210.12
(58) Field of Classification Search .................. 365/201, 365/191, 194, 189.03, 210.12
    See application file for complete search history.

(56) References Cited

U.S. PATENT DOCUMENTS

| 6,960,925 B2 * | 11/2005 | Zivanovic .................... 324/765 |
| 7,068,058 B2 * | 6/2006 | Park et al. .................... 324/763 |
| 7,259,582 B2 * | 8/2007 | Ong .......................... 324/765 |

FOREIGN PATENT DOCUMENTS

JP    2003-132698 A    5/2003

* cited by examiner

*Primary Examiner*—Pho M. Luu
(74) *Attorney, Agent, or Firm*—Sughrue Mion, PLLC

(57) ABSTRACT

A semiconductor device includes a plurality of bonding pads as bonding option, and a test circuit for performing an operation test using particular bonding pads and testing interconnects connecting internal circuits to the remaining bonding pads which are not used in the operation test.

20 Claims, 4 Drawing Sheets

SEMICONDUCTOR DEVICE

BACKGROUND OF THE INVENTION

1. Field of the Invention

The present invention relates to semiconductor devices, and in particular, relates to a semiconductor device having a plurality of bonding pads as bonding option and a test circuit, the bonding pads being connected to common internal circuits, the test circuit testing the states of interconnects between the bonding pads and the internal circuits, respectively.

2. Description of the Related Art

Recently, digital consumer devices have become smaller. Particularly, mobile devices are significantly reduced in size because a plurality of semiconductor chips are mounted on a single substrate of each device. For example, a plurality of chips, e.g., a CPU and memory devices such as a DRAM and a flash memory, are mounted on one substrate and are packaged with a resin, thus forming a single device component. Packaging technology includes various packaging designs, such as Multi-chip Package, System In Package, and Package On Package.

Packaging is principally performed in a factory of each device manufacturer. Therefore, the device manufacturer purchases semiconductor chips, such as CPUs and DRAMs, from individual semiconductor manufacturers. Each device manufacturer designs a device including the chips as compact as possible. Accordingly, the arrangement of bonding pads needed for each semiconductor chip varies from device manufacturer to device manufacturer, or from device to device. Consequently, each semiconductor manufacturer has to provide semiconductor chips with various bonding-pad arrangements in response to requests of the respective device manufacturers. For instance, a device manufacturer A requests DRAMs each having an array of pads on the left part of the chip and another device manufacturer B requests DRAMs each having an array of pads on the right part of the chip.

Under the above-described circumstances, the semiconductor manufacturers for the production of DRAMs have to produce chips with various pad arrangements for individual device manufacturers and deliver the chips to the respective manufacturers. Unfortunately, the production and delivery of the chips with various pad arrangements need time and money, leading to burdens on the semiconductor manufacturers. In consideration of the circumstances, the semiconductor manufacturers each provide the same semiconductor chips, e.g., DRAM chips each having a plurality of pads thereon in order to respond to all of requests of device manufacturers. Each device manufacturer selects any group of pads and performs a bonding process on the selected pads. Accordingly, the same DRAM chips can be delivered to the respective device manufacturers. Providing a plurality of pads, selecting necessary pads from the pads, and bonding the selected pads are called a bonding option technique.

However, since each chip includes a plurality of pads connected to common internal circuits, the semiconductor manufacturers have another problem related to an operation test. Before the shipment of chips to the respective device manufacturers as clients, each chip has to be subjected to an electrical characteristics test. If each chip includes pad groups as bonding option, any of the groups has to be selected for each client and be tested. Disadvantageously, selecting pads desired by the client from the pads, setting a probe card for bringing probes, corresponding to pads to be tested, into contact with the pads on the chip, and testing the pads also lead to a waste of time and money.

Accordingly, one group of pads are subjected to a test for DRAM, thus checking internal functions of each DRAM. In this case, other pads and interconnects are not checked. It is, therefore, necessary to test the unchecked pads and interconnects. It is preferred that unchecked pads is tested by simple, low-cost means without using a probe card.

Japanese Unexamined Patent Application Publication No. 2003-132698 discloses a test circuit for performing an operation test on semiconductor devices. In this test circuit, a plurality of memories are simultaneously subjected to the read operation to thereby detect a defective memory. The test circuit includes a current detection circuit and a fault-location identification circuit. The current detection circuit detects current flowing through an output driver of a memory connected to a tri-state bus. If a memory output includes an error, a shoot-through current flows. This shoot-through current is detected so as to identify a defective memory. For example, if an interconnect is disconnected, the disconnection cannot be detected because the test circuit detects different output levels. Unfortunately, this circuit cannot be applied to a test for interconnects connected to untested pads on a semiconductor device having a plurality of pads.

As described above, in a semiconductor device having a plurality of bonding pads connected to common internal circuits, some of the bonding pads and the corresponding interconnects are subjected to the operation test but the other pads and the associated interconnects in the vicinities thereof are untested. In the following description, a bonding pad and the associated interconnect in the vicinity thereof will be abbreviated to "pad interconnect". It is preferred to provide a method for readily testing unchecked pad interconnects without bring a probe card into contact with the unchecked pads.

SUMMARY OF THE INVENTION

Accordingly, it is an object of the present invention to provide a test circuit capable of readily testing unchecked pad interconnects in consideration of the above-described problems and a semiconductor device including the test circuit.

More specifically, the test circuit is arranged in a semiconductor chip and includes level set circuits for supplying logic-level signals to untested pads, which are not used in an operation test, and level detection circuits located in the vicinities of internal circuits. The levels of the signals output from the level set circuits are detected by the level detection circuits in the vicinities of the internal circuits.

The present invention fundamentally utilizes technology disclosed in the following description to solve the foregoing problems. The present invention also includes applied technology of which various changes and modifications are possible within the scope of the disclosed technology.

In accordance with one aspect of the present invention, there is provided a semiconductor device including a plurality of bonding pads as bonding option and a test circuit for performing an operation test using particular bonding pads and testing interconnects connecting internal circuits to the remaining bonding pads which are not used in the operation test.

In the semiconductor device according to this aspect, the test circuit may include level set circuits connected to the remaining boding pads and level detection circuits connected to the interconnects in the vicinities of the internal circuits.

In the semiconductor device according to this aspect, each level set circuit may include a driving unit for driving the corresponding remaining bonding pad at a high or low level.

In the semiconductor device according to this aspect, preferably, the channel length of a transistor constituting the driving unit is larger than the channel width thereof.

In the semiconductor device according to this aspect, each level set circuit may include a first transistor and a second transistor. The first transistor is activated in response to a high-voltage-supply enable signal and drives the corresponding interconnect at the high level. The second transistor is activated in response to a low-voltage-supply enable signal and drives the corresponding interconnect at the low level.

In the semiconductor device according to this aspect, preferably, the level set circuits each include a tri-state inverter that receives an input signal, a high-voltage-supply enable signal, and a low-voltage-supply enable signal.

In the semiconductor device according to this aspect, preferably, the level detection circuits each include a tri-state inverter for inverting the level of a signal transmitted through the corresponding interconnect and outputting the resultant signal. Respective outputs of the tri-state inverters are connected to each other.

In the semiconductor device according to this aspect, the test circuit may further include a determination circuit that receives outputs of the level detection circuits.

In the semiconductor device according to this aspect, the determination circuit compares outputs of the level detection circuits connected to the respective interconnects to determine whether all of the outputs are at the same level.

In accordance with another aspect of the present invention, there is provided a test circuit including level set circuits connected to bonding pads and level detection circuits connected to interconnects connecting the bonding pads to internal circuits. The test circuit tests the state of connection between each bonding pad, connected to the level set circuit, and the corresponding internal circuit.

According to this aspect, the test circuit may further include a determination circuit receiving outputs of the level detection circuits.

In accordance with the present invention, a semiconductor device includes a plurality of pads as bonding option connected to common internal circuits and a test circuit. The test circuit includes level set circuits for supplying logic-level signals to untested pads and level detection circuits for detecting signal levels of the level set circuits in the vicinities of the internal circuits. This structure allows the test circuit to readily check the untested pads and interconnects.

With the above-described structure, the following advantages can be obtained.

First, it is unnecessary to form a plurality of measuring devices, e.g., probe cards, used for test, leading to a reduction in cost and time.

Second, in testing a device including a semiconductor device (chip) according to the present invention, a fault point can be identified. It is assumed that a fault, such as a current leak related to an input signal or a disconnection, is detected. In this case, whether the fault point exists inside or outside the semiconductor chip can be determined. An external fault includes, for example, a bonding wire disconnection or a short circuit of an interconnect in a substrate of a package. Locating a fault is required to identify who is responsible for the fault because a plurality of semiconductor manufacturers provide chips and a device manufacturer assembles the chips into a device under the recent circumstances.

Third, the test circuit having the above-described first and second advantages can be readily provided in a space-saving manner. In addition, a test can be simply performed. An increase in size of a semiconductor chip having the test circuit is very small, thus minimizing a reduction in the number of chips per wafer. Moreover, the test can be performed with no difficulty. Thus, a test operator can perform programming for a short time. The total cost, therefore, can be minimized.

DESCRIPTION OF THE PREFERRED EMBODIMENTS

A semiconductor device according to the present invention will now be described with reference to the drawings.

First Embodiment

Figure 1:
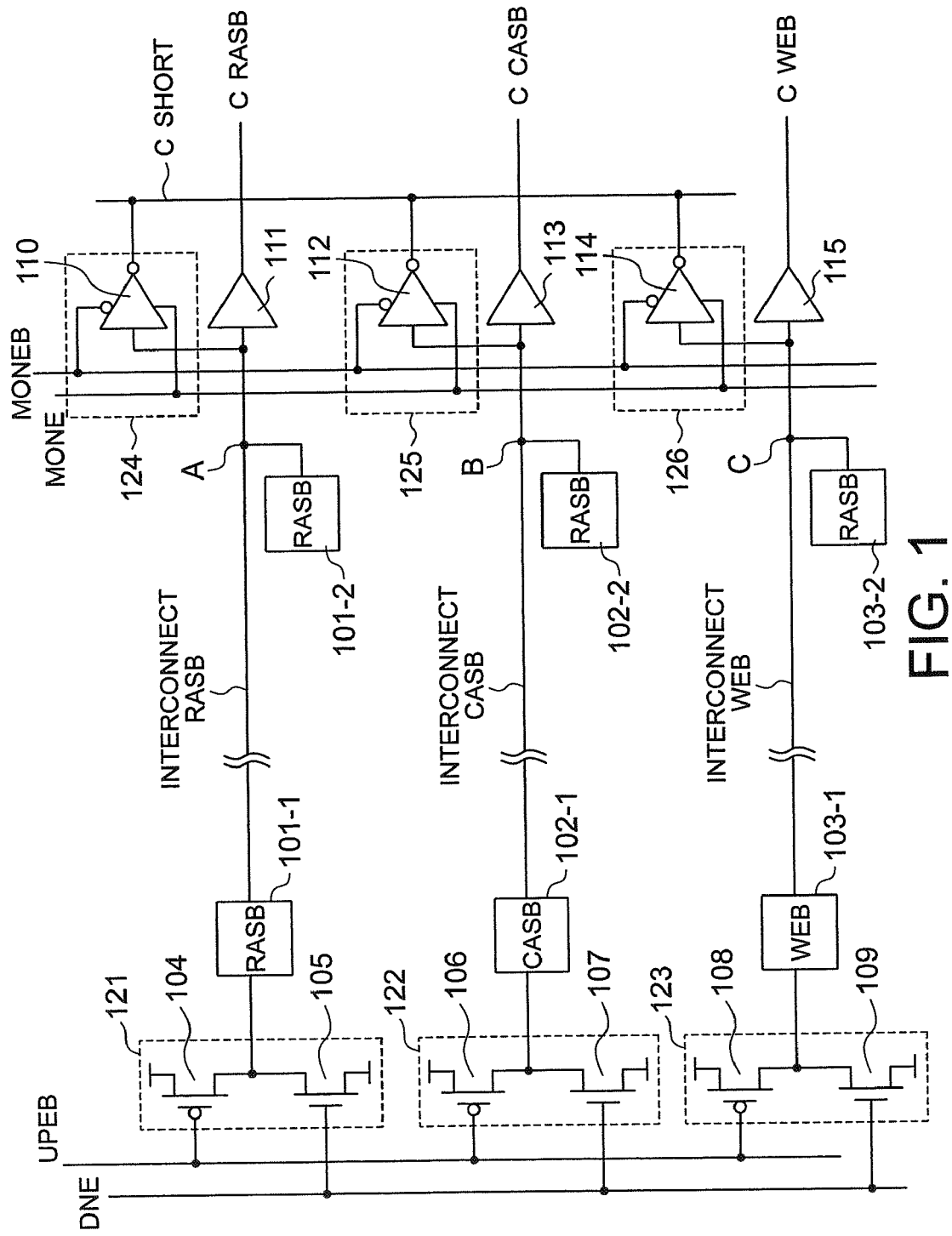
FIG. 1 is a diagram showing a test circuit according to a first embodiment of the present invention.
Figure 2:
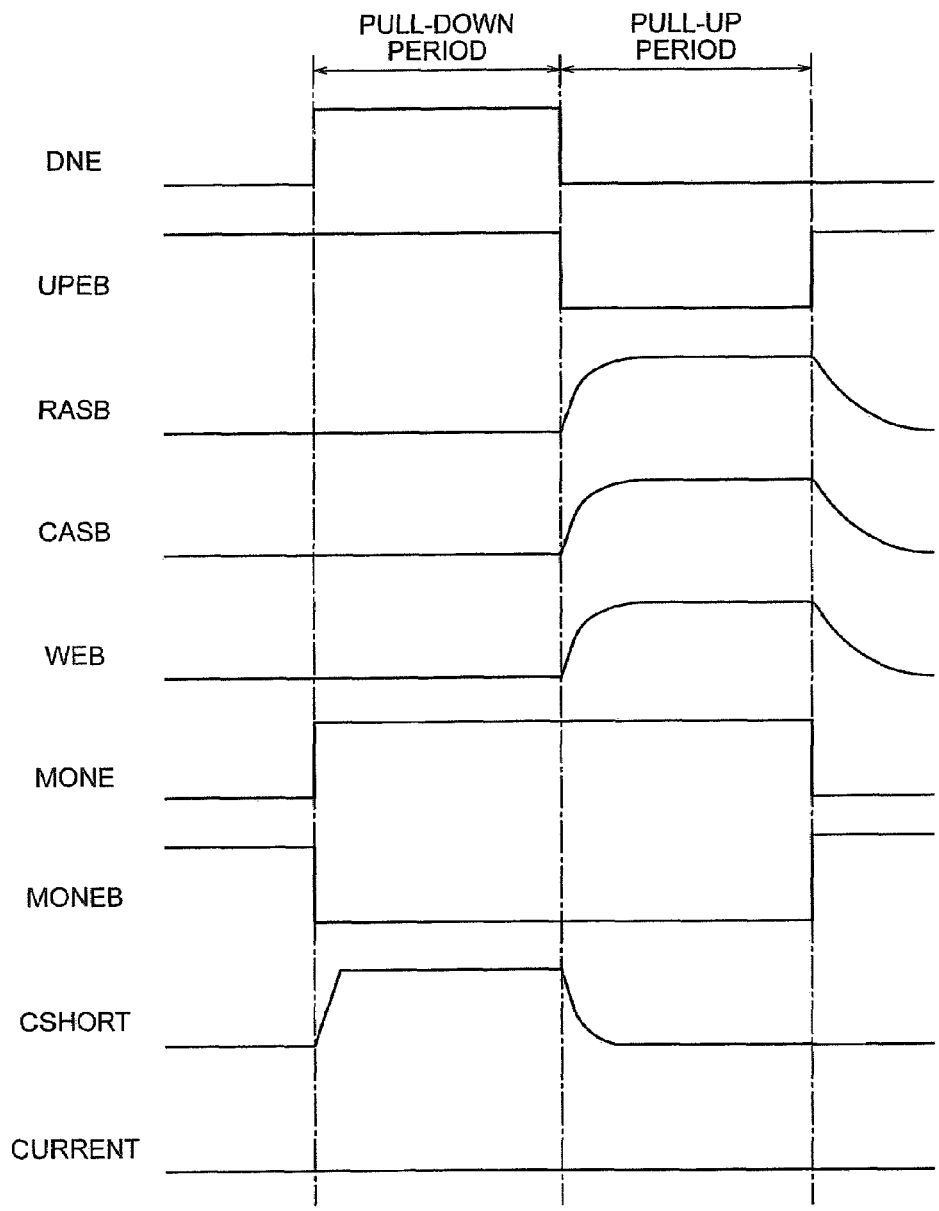
FIG. 2 is a waveform chart when pad and interconnects according to the first embodiment include no fault.
Figure 3:
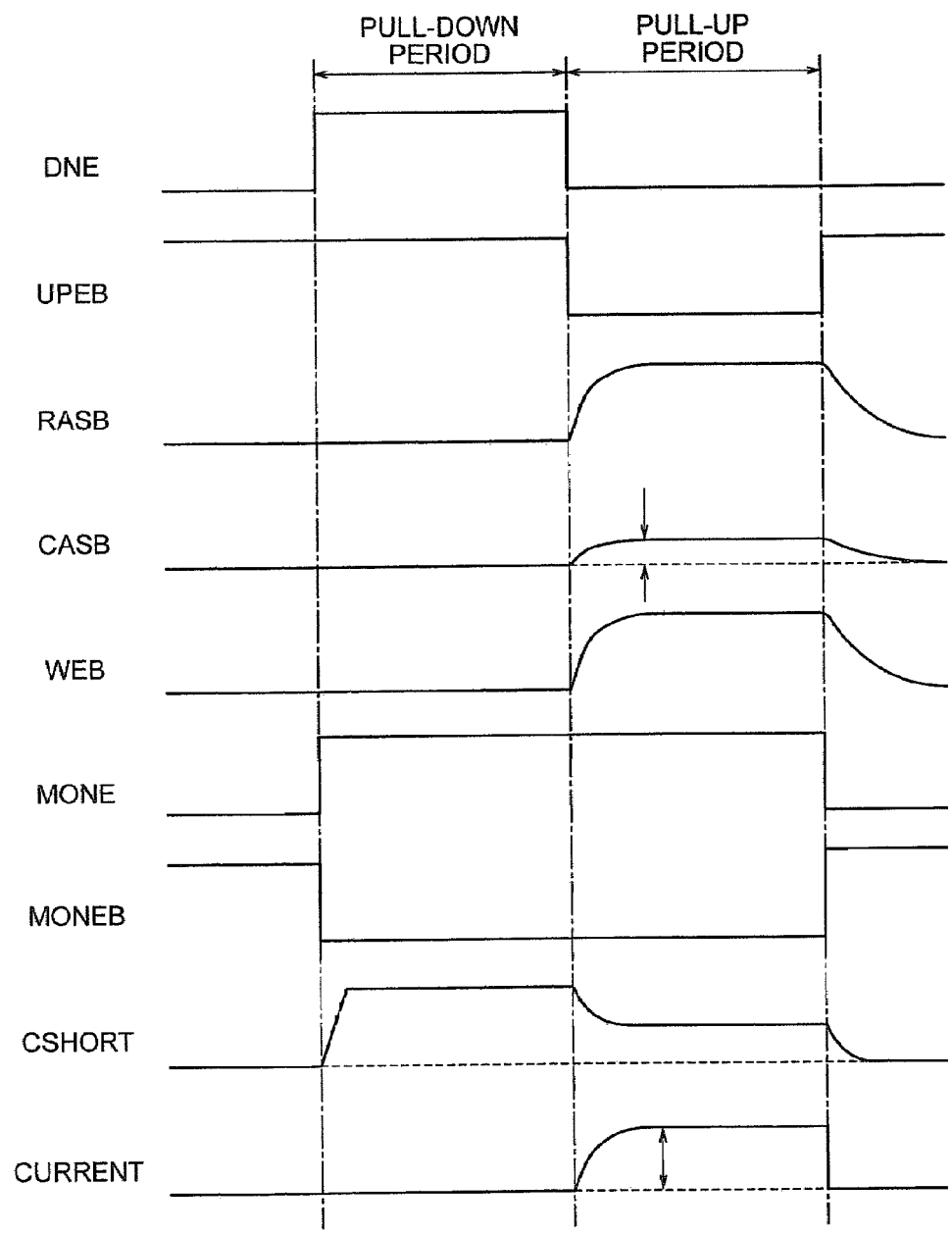
FIG. 3 is a waveform chart when the pads and interconnects according to the first embodiment include a fault.

A first embodiment of the present invention will now be described with reference to FIGS. 1 to 3. FIG. 1 is a diagram illustrating a test circuit according to the first embodiment. FIG. 2 is a waveform chart when interconnects include no fault. FIG. 3 is a waveform chart when the interconnects have a fault.

FIG. 1 shows an example of the test circuit according to the first embodiment of the present invention. Referring to FIG. 1, each internal circuit has two bonding pads. For example, an input receiver circuit 111, serving as an internal circuit, is connected to two bonding pads 101-1 and 101-2 for a signal RASB. Similarly, an input receiver circuit 113 is connected to two bonding pads 102-1 and 102-2 for a signal CASB and an input receiver circuit 115 is connected to two bonding pads 103-1 and 103-2 for a signal WEB. According to the present invention, input terminals RASB, CASB, and WEB are described. The present invention is not limited to those terminals but is applicable to, for example, other input terminals and output terminals.

Among the pairs of bonding pads, the bonding pads 101-2, 102-2, and 103-2 have been used during an operation test. The other bonding pads 101-1, 102-1, and 103-1 are not used during the operation test. Accordingly, an interconnect for the signal RASB (hereinafter, interconnect RASB) between the bonding pad 101-1 and a node A, an interconnect for the signal CASB (hereinafter, interconnect CASB) between the bonding pad 102-1 and a node B, and an interconnect for the signal WEB (hereinafter, interconnect WEB) between the bonding pad 103-1 and a node C are not yet tested. These untested pads and the interconnects between the untested pads and the corresponding nodes will be collectively called pad interconnects. Those interconnects RASB, CASB, and WEB will also be simply called interconnects.

According to the present embodiment, the test circuit readily tests those untested pad interconnects. The test circuit includes level set circuits 121, 122, and 123 and level detection circuits 124, 125, and 126. The level set circuits 121, 122, and 123 are connected to the untested bonding pads, respectively. The level detection circuits 124, 125, and 126 are connected to the interconnects in the vicinities of the tested internal circuits, respectively. The level set circuit 121 supplies a signal having a certain level to the bonding pad 101-1 and the level detection circuit 124 detects the level of the supplied signal. In this manner, the untested part of the interconnect RASB is checked. Similarly, the level set circuit 122 and the level detection circuit 125 check the untested part of the interconnect CASB. In addition, the level set circuit 123 and the level detection circuit 126 check the untested part of the interconnect WEB.

The level set circuits 121, 122, and 123 are disposed in the vicinities of the untested bonding pads 101-1, 102-1, and 103-1, respectively. Outputs of the level set circuits are connected to the corresponding bonding pads, respectively. The level set circuit 121 is composed of a P-channel transistor 104 and an N-channel transistor 105. The P-channel transistor 104 pulls up the bonding pad 101-1. The N-channel transistor 105 pulls down the bonding pad 101-1. The drain, source, and gate of the P-channel transistor 104 are connected to the bonding pad 101-1, a high voltage supply VDD, and a high-voltage-supply enable signal UPEB, respectively. The drain, source, and gate of the N-channel transistor 105 are connected to the bonding pad 101-1, a low voltage supply VSS, and a low-voltage-supply enable signal DNE, respectively.

The enable signal UPEB is a control signal for supplying high level inputs to the bonding pads. The enable signal DNE is a control signal for supplying low level inputs to the bonding pads. The enable signals UPEB and DNE may be internally generated on the basis of commands supplied in a test mode. Alternatively, test pads for the enable signals UPEB and DNE may be arranged and these pads may generate the enable signals.

The level set circuit 122 is composed of a P-channel transistor 106 for pulling up the bonding pad 102-1 and an N-channel transistor 107 for pulling down the bonding pad 102-1. The drain, source, and gate of the P-channel transistor 106 are connected to the bonding pad 102-1, the high voltage supply VDD, and the high-voltage-supply enable signal UPEB, respectively. The drain, source, and gate of the N-channel transistor 107 are connected to the bonding pad 102-1, the low voltage supply VSS, and the low-voltage-supply enable signal DNE, respectively.

The level set circuit 123 is composed of a P-channel transistor 108 for pulling up the bonding pad 103-1 and an N-channel transistor 109 for pulling down the bonding pad 103-1. The drain, source, and gate of the P-channel transistor 106 are connected to the bonding pad 103-1, the high voltage supply VDD, and the high-voltage-supply enable signal UPEB, respectively. The drain, source, and gate of the N-channel transistor 109 are connected to the bonding pad 103-1, the low voltage supply VSS, and the low-voltage-supply enable signal DNE, respectively.

The channel length L of each of the P-channel transistors 104, 106, and 108 is larger than the channel width thereof. For instance, the channel length is 4 μm while the channel width is 1 μm. As for the P-channel transistors 104, 106, and 108, therefore, when the channel is strongly inverted and the transistor is turned on, the source-drain resistance is on the order of several MΩ. In other words, each P-channel transistor has capability to supply a very small current. Similarly, each of the N-channel transistors 105, 107, and 109 has a channel length of 8 μm or more and a channel width of approximately 1 μm so that the source-drain resistance is on the order of several MΩ in the ON state. As described above, each level set circuit includes the transistors having small current supply capability.

The interconnect RASB connects to the bonding pad 101-1, the node A, and the input receiver circuit 111, serving as an internal circuit and further connects to the other bonding pad 101-2 via the node A. Similarly, the interconnect CASB connects to the bonding pads 102-1 and 102-2, the node B, and the input receiver circuit 113. The interconnect WEB connects to the bonding pads 103-1 and 103-2, the node C, and the input receiver circuit 115. The respective input receiver circuits 111, 113 and 115 output signals CRASB, CCASB, and CWEB as chip internal signals, respectively.

The level detection circuits 124, 125, and 126 are disposed in the vicinities of the input receiver circuits 111, 113, and 115, respectively. A tri-state inverter 110, serving as the level detection circuit 124, is connected to the interconnect RASB in the vicinity of the input receiver circuit 111. An input signal transmitted through the interconnect RASB, a high-voltage-supply enable signal MONEB, and a low-voltage-supply enable signal MONE are supplied to the tri-state inverter 110. Similarly, a tri-state inverter 112, serving as the level detection circuit 125, is connected to the interconnect CASB in the vicinity of the input receiver circuit 113. An input signal transmitted through the interconnect CASB and the enable signals MONEB and MONE are supplied to the tri-state inverter 112.

Similarly, a tri-state inverter 114, functioning as the level detection circuit 126, is connected to the interconnect WEB in the vicinity of the input receiver circuit 115. An input signal transmitted through the interconnect WEB and the enable signals MONEB and MONE are supplied to the tri-state inverter 114. Each of the tri-state inverters 110, 112, and 114 is enabled in response to the high-voltage-supply and low-voltage-supply enable signals MONEB and MONE, inverts the level of an input signal, and outputs the resultant signal. When the enable signals MONEB and MONE are deactivated, each tri-state inverter outputs a high impedance signal. Output lines of the tri-state inverters 110, 112, and 114 are connected to each other. A common output node will be named CSHORT.

According to the present embodiment, the test circuit includes the level set circuits connected to the untested bonding pads and the level detection circuits connected to the interconnects in the vicinities of the input receiver circuits which have been subjected to the operation test. In the present embodiment, for the sake of convenience, signal names RASB, CASB, and WEB are used. Obviously, any signal can be used. In addition, the number of bonding pads to be tested, the number of input receiver circuits, and the number of input lines are not limited to those in the above-described example. It is obvious that those numbers may be increased.

The operation of the test circuit in FIG. 1 will now be described with reference to FIGS. 2 and 3. FIG. 2 shows operation waveforms obtained when the interconnects RASB, CASB, and WEB have no fault. FIG. 3 shows operation waveforms obtained when the interconnects RASB and WEB has no fault but a short circuit is caused by a foreign matter between the interconnect CASB and the low voltage supply VSS.

Referring to FIG. 2, upon starting a test, the low-voltage-supply enable signal MONE at a level "L" (low) is set to a level "H" (high) and the high-voltage-supply enable signal MONEB at the level "H" is set to the level "L". Consequently, the tri-state inverters 110, 112, and 114, functioning as the level detection circuits, are enabled, so that the tri-state inverters enter an output enable mode in which each inverter outputs a signal having a level depending on the corresponding input level. Simultaneously, during the pull-down period, the low-voltage-supply enable signal DNE at the level "L" is set to the level "H". Thus, the N-channel transistors 105, 107, and 109 are brought into conduction, i.e., turned on, so that the bonding pad 101-1, the interconnect RASB, the bonding pad 102-1, the interconnect CASB, the bonding pad 103-1, and the interconnect WEB are driven at the level "L".

Since the bonding pad 101-1 and the interconnect RASB have the same potential, reference symbol RASB collectively denotes them in FIGS. 2 and 3. The same applies to reference symbols CASB and WEB. The tri-state inverters 110, 112, and 114 outputs signals at the level "H" to the common node CSHORT. Since the output signals of the tri-state inverters 110, 112, and 114 are at the level "H", current CURRENT does not flow through the common node CSHORT.

It is assumed that any one of the interconnects RASB, CASB, and WEB has a short circuit with the high voltage supply VDD. In this case, when the electric resistance of the short circuit is hundreds of KΩ or lower, the corresponding level set circuit cannot be driven not at a level VSS (i.e., the level "L") but at the level "H". Accordingly, any of the tri-state inverters 110, 112, and 114 outputs a signal at the level "L". Since the "L"-level signal and the "H"-level signals are output to the common node CSHORT, shoot-through current flows among the tri-state inverters. As described above, when the current CURRENT flows through the common node CSHORT, a trouble in the interconnects can be detected.

During the pull-up period, the low-voltage-supply enable signal DNE is changed from the level "H" to the level "L" and the high-voltage-supply enable signal UPEB is also changed form the level "H" to the level "L". In the level set circuits, the N-channel transistors 105, 107, and 109 are brought into non-conduction, i.e., turned off and the P-channel transistors 104, 106, and 108 are turned on. Thus, the bonding pad 101-1, the interconnect RASB, the bonding pad 102-1, the interconnect CASB, the bonding pad 103-1, and the interconnect WEB, which are at the level "L", are driven at the level "H". The tri-state inverters 110, 112, and 114 outputs signals at the level "L". FIG. 2 shows the states of the respective components when there is no fault. The current CURRENT is 0.

In this event, it is assumed that any of the pad interconnects has a fault. For example, it is assumed that any of the pad interconnects has a short circuit with the low voltage supply, alternatively, any of them has a disconnection. In this case, the pad interconnect having the fault is at the level "L" and the corresponding tri-state inverter outputs a signal at the level "H". The other tri-state inverters, which receive inputs through the pad interconnects having no defects, output signals at the level "L". The competition among the "H"-level and "L"-level outputs from the tri-state inverters causes the current CURRENT flowing through the common node CSHORT. As described above, when the current CURRENT flows through the common node CSHORT, a trouble in the interconnects can be detected.

FIG. 3 shows operation waveforms obtained when a short circuit exists between any interconnect and the low voltage supply (VSS). In FIG. 3, it is assumed that a short circuit exists between the interconnect CASB and the low voltage supply (VSS) and the electric resistance of the short circuit is hundreds of KΩ or lower. Upon starting a test, the low-voltage-supply enable signal MONE at the level "L" is set to the level "H" and the high-voltage-supply enable signal MONEB at the level "H" is set to the level "L" in a manner similar to the case of FIG. 2. Consequently, the tri-state inverters 110, 112, and 114, functioning as the level detection circuits, are enabled, so that the tri-state inverters enter an output enable mode in which each inverter outputs a signal having a level depending on the corresponding input level.

Simultaneously, during the pull-down period, the low-voltage-supply enable signal DNE is changed from the level "L" to the level "H". Thus, the N-channel transistors 105, 107, and 109 are turned on, so that the bonding pad 101-1, the interconnect RASB, the bonding pad 102-1, the interconnect CASB, the bonding pad 103-1, and the interconnect WEB are driven at the level "L". Although the interconnect CASB is short-circuited with the low voltage supply, the interconnect CASB is at the level "L" and the level is not affected. All of the tri-state inverters 110, 112, and 114 output "H"-level signals to the common node CSHORT. Since the outputs of the tri-state inverters 110, 112, and 114 are at the level "H", the current CURRENT does not flow through the common node CSHORT.

During the pull-up period, the low-voltage-supply enable signal DNE is changed from the level "H" to the level "L" and the high-voltage-supply enable signal UPEB is also changed form the level "H" to the level "L". The N-channel transistors 105, 107, and 109 of the level set circuits are turned off and the P channel transistors 104, 106, and 108 thereof are turned on. Thus, the bonding pad 101-1, the interconnect RASB, the bonding pad 102-1, the interconnect CASB, the bonding pad 103-1, and the interconnect WEB, which are at the level "L", are driven at the level "H". The interconnects RASB and WEB become the level "H". However, since the interconnect CASB is short-circuited with the low voltage supply (VSS), the "L"-level signal competes with the "H"-level signals, so that the interconnect CASB cannot go to the level "H" that is higher than the threshold of the tri-state inverter 112.

Consequently, the tri-state inverters 110 and 114, serving as the level detection circuits, output signals at the level "L" and the tri-state inverter 112 outputs a signal at the level "H". In the common node CSHORT, the "H"-level signal competes with the "L"-level signals, so that a current flows from the high voltage supply of the tri-state inverter 112 to the low voltage supplies of the tri-state inverters 110 and 114. This current corresponds to the current CURRENT in FIG. 3. The channel width W of each of the tri-state inverters 110, 112, and 114 is set so that the current CURRENT is equal to approximately 1 mA. The reasons are as follows. Specifically, a change in current of several mA may be determined with high sensitivity by a measuring device. The change in current of several mA is not affected by a measurement noise. In addition, a measurement noise does not lead to an unstable result. On the other hand, if the test circuit is designed such that a large current flows, a physical phenomenon, e.g., electromigration, may be caused due to high current density, leading to a fault, such as a disconnection. The test circuit, therefore, is designed so that a current of approximately 1 mA flows.

It is assumed that a fault is caused not by a short-circuit between the interconnect CASB and the low voltage supply (VSS) but by a disconnection of the interconnect. In this case, an "H"-level signal output from the associated level set circuit is not transmitted to the corresponding level detection circuit. As will be easily understood, therefore, the current CURRENT may be generated due to a phenomenon similar to that causing the foregoing short-circuit with the low voltage supply. In other words, if the interconnect CASB has a disconnection, the gate level of the tri-state inverter 112 is fixed to the level "L" as in the case of the phenomenon related to the short circuit with the low voltage supply. Further, it is assumed that the interconnect CASB is short-circuited not with the low voltage supply (VSS) but with the high voltage supply (VDD). In this case, during the pull-down period, the level set circuit 122 supplies an "L"-level signal to the interconnect CASB, so that the "L"-level signal competes with "H"-level signals. Consequently, the interconnect CASB goes to the level "H" and the tri-state inverter 112 outputs a signal at the level "L". A current, therefore, flows from the high voltage supplies of the tri-state inverters 110 and 114 to the low voltage supply of the tri-state inverter 112. In this manner, the fault can be detected.

In the test circuit according to the present embodiment, the level set circuits are connected to the untested bonding pads, the level detection circuits are connected to the interconnects in the vicinities of the tested internal circuits, and the outputs of the respective level detection circuits are connected to each other via the common node. If any interconnect has a fault, the level detection circuits detect the levels of signals supplied from the respective level set circuits and a current flows through the common node. In this manner, the fault of the interconnect can be detected. According to this embodiment, the test circuit for detecting a fault in the interconnects connected to untested bonding pads with the above-described structure and a semiconductor device including the test circuit can be obtained.

Second Embodiment

Figure 4:
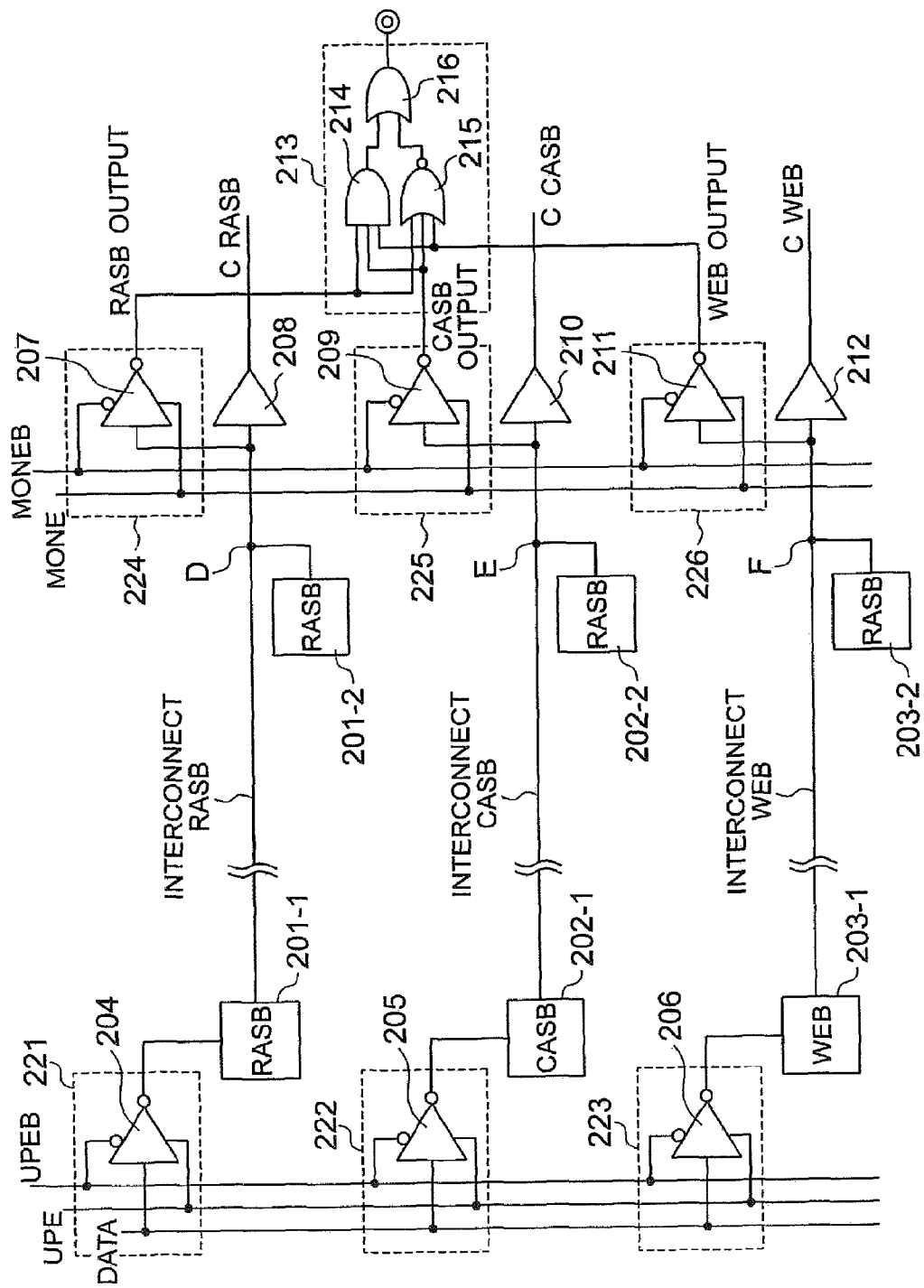
FIG. 4 is a diagram illustrating a test circuit according to a second embodiment.

A second embodiment of the present invention will be described below with reference to FIG. 4. FIG. 4 is a diagram showing a test circuit according to the second embodiment. According to the present embodiment, the test circuit includes level set circuits connected to bonding pads, level detection circuits connected to interconnects in the vicinities of internal circuits, and a determination circuit for determining outputs of the level detection circuits.

Referring to FIG. 4, each internal circuit includes two bonding pads. In other words, the internal circuits include a pair of bonding pads 201-1 and 201-2, those 202-1 and 202-2, and those 203-1 and 203-2, respectively. In the same way as the first embodiment, the pair of bonding pads are related to signals RASB, CASB, and WEB, respectively. The bonding pads 201-2, 202-2, and 203-2 have been used in an operation test. The other bonding pads 201-1, 202-1, and 203-1 are not used in the operation test. Accordingly, an interconnect for the signal RASB (hereinafter, interconnect RASB) between the bonding pad 201-1 and a node D, an interconnect for the signal CASB (hereinafter, interconnect CASB) between the bonding pad 202-1 and a node E, and an interconnect for the signal WEB (hereinafter, interconnect WEB) between the bonding pad 203-1 and a node F are not yet untested.

The second embodiment differs from the first embodiment in the structure of each level set circuit. In addition, the second embodiment differs from the first embodiment in that the determination circuit receives outputs of the respective level detection circuits and outputs a determination output. Level set circuits 221, 222, and 223 are connected to the untested bonding pads. The level set circuits 221, 222, and 223 include tri-state inverters 204, 205, and 206, respectively. Level detection circuits 224 to 226 are connected to the interconnects in the vicinities of the internal circuits which have been tested. The level detection circuits 224, 225, and 226 include tri-state inverters 207, 209, and 211, respectively. Outputs of the level detection circuits 224 to 226 are supplied to a determination circuit 213. The determination circuit 213 outputs a determination output indicating the result of determination.

Outputs of the level set circuits 221, 222, and 223 are connected to the untested bonding pad 201-1, 202-1, and 203-1, respectively. The level set circuit 221 is composed of the tri-state inverter 204. The tri-state inverter 204 receives an input signal DATA, a high-voltage-supply enable signal UPEB, and a low-voltage-supply enable signal UPE. When the enable signals UPEB and UPE are activated, the tri-state inverter 204 inverts the level of the input signal DATA and outputs the resultant signal to the bonding pad 201-1. When the enables signals UPEB and UPE are deactivated, the output of the tri-state inverter 204 becomes high impedance.

The level set circuit 222 includes the tri-state inverter 205 and the level set circuit 223 includes the tri-state inverter 206. The structure of each of the tri-state inverters 205 and 206 is the same as that of the tri-state inverter 204. Outputs of the tri-state inverters 205 and 206 are supplied to the bonding pads 202-1 and 203-1, respectively. As for output transistors of these tri-state inverters 204 to 206, the channel length L of each transistor is larger than the channel width W thereof. Detailed settings of the drive capability of each transistor are the same as those described in the first embodiment. Therefore, a description of the settings is omitted. The input signal DATA and the enable signals UPEB and UPE may be generated on the basis of commands supplied in a test mode. Alternatively, a pad for the input signal DATA, a pad for the high-voltage-supply enable signal UPEB, and a pad for the low-voltage-supply enable signal UPE may be provided and these pads may supply the signals DATA, UPEB, and UPE, respectively.

In the present embodiment, the outputs of the level set circuits 221, 222, and 223 are connected to the upper sides, as viewed in the diagram, of the untested bonding pads 201-1, 202-1, and 203-1, respectively. On the other hand, in the first embodiment, the outputs of the level set circuits 121, 122, and 123 are connected to the sides of the untested bonding pads 101-1, 102-1, and 103-1, respectively, the connected sides being opposed to the sides from which the respective interconnects extend. The level set circuits supply signals each having a certain level to the corresponding bonding pads, respectively. As long as the level set circuits are connected to the bonding pads, connection points are not particularly restricted.

The interconnect RASB extending from the bonding pad 201-1 connects to an input receiver circuit 208 via the node D. The interconnect RASB also connects to the other bonding pad 201-2 via the node D. Similarly, the interconnect CASB connects to the bonding pads 202-1 and 202-2, the node E, and an input receiver circuit 210. The interconnect WEB connects to the bonding pads 203-1 and 203-2, the node F, and an input receiver circuit 212. The input receiver circuits output chip internal signals, i.e., signals CRASB, CCASB, and CWEB, respectively.

The level detection circuits 224, 225, and 226 are arranged in the vicinities of the input receiver circuits 208, 210, and 212, respectively. The tri-state inverter 207, functioning as the level detection circuit 224, is connected to the interconnect RASB in the vicinity of the input receiver circuit 208. An input signal transmitted through the interconnect RASB, a high-voltage-supply enable signal MONEB, and a low-voltage-supply enable signal MONE are input to the tri-state inverter 207. Similarly, the tri-state inverter 209, functioning as the level detection circuit 225, is connected to the interconnect CASB in the vicinity of the input receiver circuit 210. The tri-state inverter 209 receives an input signal transmitted through the interconnect CASB. The tri-state inverter 211, serving as the level detection circuit 226, is connected to the interconnect WEB in the vicinity of the input receiver circuit 212. The tri-state inverter 211 receives an input signal transmitted through the interconnect WEB. Each of the level detection circuits 225 and 226 also receives the high-voltage-supply enable signal MONEB and the low-voltage-supply enable signal MONE.

The tri-state inverters 207, 209, and 211 supply outputs RASB, CASB, and WEB to the determination circuit 213, respectively. Only when all of the outputs RASB, CASB, and WEB are at the level "H" or "L", the determination circuit 213 outputs a determination output at the level "H". If not, the determination output goes to the level "L". Circuitry realizing the above-described logic is not particularly limited. According to the present embodiment an AND circuit 214, a NOR circuit 215, and an OR circuit 216 are disposed. The OR circuit 216 performs the OR operation on outputs of the circuits 214 and 215. In this case, when input signals are at the level "H", the AND circuit 214 performs the AND operation on the input signals and outputs a signal at the level "H". On the other hand, when input signals are at the level "L", the NOR circuit 215 performs the OR operation on the input signals, inverts the result, and outputs a signal at the level "H". When either of the outputs of the circuits 214 and 215 is at the level "H", the OR circuit 216 outputs a signal at the level "H". If the OR circuit 216 outputs a signal at the level "L", any of the interconnects has a defect.

The operation of the present test circuit will be simply described below. Upon starting a test, the high-voltage-supply enable signal MONEB to be supplied to the level detection circuits is set to the level "L" and the low-voltage-supply enable signal MONE to be supplied thereto is set to the level "H", thus enabling the associated tri-state inverters. In addition, the high-voltage-supply enable signal UPEB to be supplied to the level set circuits is set to the level "L" and the low-voltage-supply enable signal UPE to be supplied thereto is set to the level "H", thus enabling the associated tri-state inverters. During the pull-down period, the input signal DATA to be supplied to the level set circuits is set to the level "H" so as to supply an "L"-level signal to each of the untested bonding pads. The input "L"-level signals are supplied to the associated level detection circuits via the respective interconnects. Each of the level detection circuits inverts the level of the supplied signal and outputs the resultant signal to the determination circuit.

During the pull-up period, the input signal DATA is set to the level "L", thus supplying an "H"-level signal to each of the untested bonding pads. The input "H"-level signals are supplied to the respective level detection circuits via the interconnects. Each level detection circuit inverts the level of the input signal and outputs the inverted signal to the determination circuit. If the pad interconnects have no defects, the outputs of the level detection circuits become the same level, so that the determination circuit outputs a signal at the level "H". If any of the pad interconnects includes a defect, the level detection circuit connected to the defective pad interconnect outputs a signal having a different level. Thus, the determination circuit outputs a signal at the level "L". As described above, a defect in the pad interconnects can be detected on the basis of the output level of the determination circuit.

How to extract a determination output of the determination circuit as the test result from the chip is not particularly restricted. For example, a signal path to be enabled in response to a test mode signal may be connected to an output buffer to extract a signal from a specified output pad. In addition, a DC current of the chip in standby mode may be increased or decreased in accordance with a determination value, as will be readily expected.

The input receiver circuits 208, 210, and 212 may function as the tri-state inverters 207, 209, and 211, respectively. In this case, the foregoing tri-state inverters 207, 209, and 211 may be omitted. However, signals MONE and MONEB used for the distinction of the test mode from the normal mode are necessary. As will be easily understood, those signals may be supplied to logic components of the input receiver circuits 208, 210, and 211, serving as first input stages. In this case, outputs of the first input stages may be supplied to the determination circuit as described above. In this instance, paths for the control signals, used for the distinction of the test mode from the normal mode, to the determination circuit may be disposed in addition to signal paths for the normal operation.

According to the present embodiment, the test circuit includes the level set circuits connected to the untested bonding pads, the level detection circuits connected to the interconnects in the vicinities of the tested internal circuits, and the determination circuit to which the outputs of the level detection circuits are supplied. If any of the interconnects has a fault, the level detection circuits detect the levels of signals supplied from the respective level set circuits. On the basis of the logical output level of the determination circuit, a fault in the interconnects can be detected. According to the present embodiment, the test circuit for detecting a fault in interconnects connected to untested bonding pads with the above-described structure and a semiconductor device including the test circuit can be obtained.

According to the above-described embodiment, for the sake of convenience, signal names RASB, CASB, and WEB are used. Obviously, any signal can be used. In addition, the number of target bonding pads, the number of internal circuits, and the number of interconnects are not limited to those in the above-described example. It is obvious that those numbers may be increased. It should be understood that the present invention is not limited to the foregoing embodiments and various changes and modifications thereof could be made without departing from the spirit and scope of the invention.

What is claimed is:

1. A semiconductor device comprising:
   a plurality of bonding pads which are not used for electrical characteristics testing of an internal circuit of the semiconductor device, each of the plurality of bonding pads connected by its own interconnect in common to an internal circuit node of the semiconductor device; and
   a plurality of test circuits for testing the plurality of bonding pads and associated interconnects, one of the plurality of test circuits connected to each of the plurality of bonding pads.

2. The semiconductor device according to claim 1, wherein each test circuit includes:
   a level set circuit connected to the bonding pads; and
   a level detection circuit connected to the interconnects in the vicinity of the internal circuit.

3. A semiconductor device comprising:
   a plurality of bonding pads as bonding option; and
   a test circuit for performing an operation test using particular bonding pads and testing interconnects connecting internal circuits to the remaining bonding pads which are not used in the operation test,
   wherein the test circuit includes:
   level set circuits connected to the remaining boding pads; and
   level detection circuits connected to the interconnects in the vicinities of the internal circuits, and
   wherein each level set circuit includes driving means for driving the corresponding remaining bonding pad at a high or low level.

4. The semiconductor device according to claim 3, wherein a channel length of a transistor constituting the driving means is larger than a channel width of the transistor.

5. A semiconductor device comprising:
   a plurality of bonding pads as bonding option; and
   a test circuit for performing an operation test using particular bonding pads and testing interconnects connecting internal circuits to the remaining bonding pads which are not used in the operation test, wherein the test circuit includes:
level set circuits connected to the remaining boding pads; and
level detection circuits connected to the interconnects in the vicinities of the internal circuits, and
wherein each level set circuit includes:
a first transistor activated in response to a high-Voltage-supply enable signal, the first transistor driving the corresponding interconnect at a high level; and
a second transistor activated in response to a low-voltage-supply enable signal, the second transistor driving the corresponding interconnect at a low level.

6. A semiconductor device comprising:
a plurality of bonding pads as bonding option; and
a test circuit for performing an operation test using particular bonding pads and testing interconnects connecting internal circuits to the remaining bonding pads which are not used in the operation test,
wherein the test circuit includes:
level set circuits connected to the remaining boding pads; and
level detection circuits connected to the interconnects in the vicinities of the internal circuits, and
wherein the level set circuits each include a tri-state inverter that receives an input signal, a high-voltage-supply enable signal, and a low-voltage-supply enable signal.

7. A semiconductor device comprising:
a plurality of bonding pads as bonding option; and
a test circuit for performing an operation test using particular bonding pads and testing interconnects connecting internal circuits to the remaining bonding pads which are not used in the operation test,
wherein the test circuit includes:
level set circuits connected to the remaining boding pads; and
level detection circuits connected to the interconnects in the vicinities of the internal circuits, and
wherein the level detection circuits each include a tri-state inverter for inverting a level of a signal transmitted through the corresponding interconnect and outputting a resultant signal, and respective outputs of the tri-state inverters are connected to each other.

8. A semiconductor device comprising:
a plurality of bonding pads as bonding option; and
a test circuit for performing an operation test using particular bonding pads and testing interconnects connecting internal circuits to the remaining bonding pads which are not used in the operation test,
wherein the test circuit includes:
level set circuits connected to the remaining boding pads;
level detection circuits connected to the interconnects in the vicinities of the internal circuits; and
a determination circuit that receives outputs of the level detection circuits.

9. The semiconductor device according to claim 8, wherein the determination circuit compares outputs of the level detection circuits connected to the respective interconnects to determine whether all of the outputs are at the same level.

10. A test circuit comprising:
a plurality of level set circuits, each connected to one of a plurality of bonding pads; and
a level detection circuit connected to a plurality of interconnects, each of the plurality of interconnects connecting one of the plurality of bonding pads to an internal circuit,
wherein the test circuit tests a connection between each of the plurality of bonding pads and the internal circuit.

11. A test circuit comprising:
level set circuits connected to bonding pads;
level detection circuits connected to interconnects connecting the bonding pads to internal circuits; and
a determination circuit receiving outputs of the level detection circuits,
wherein the test circuit tests a state of connection between each bonding pad, connected to the level set circuit, and the corresponding internal circuit.

12. A semiconductor device comprising:
a circuit node connected to an internal circuit by a first interconnect;
a first bonding pad, which provides an operational test connection to the internal circuit, connected to the circuit node;
a second bonding pad connected to the circuit node by a second interconnect; and
a test circuit connected to the second bonding pad,
wherein the test circuit tests the second interconnect between the second bonding pad and the circuit node.

13. The semiconductor device according to claim 12, wherein the test circuit comprises:
a level setting circuit connected to the second bonding pad; and
a level detection circuit connected to the first interconnect in a vicinity between the circuit node and the internal circuit.

14. The semiconductor device according to claim 13, wherein the level setting circuit includes driving means for driving the second bonding pad with a signal at a high or low level.

15. The semiconductor device according to claim 14, wherein the level detection circuit includes a tri-state inverter for inverting a level of a signal transmitted by the level setting circuit from the second bonding pad through the second interconnect and outputting a resultant signal.

16. The semiconductor device according to claim 15, wherein a plurality of second bonding pads are connected to the circuit node by a plurality of second interconnects.

17. The semiconductor device according to claim 12, further comprising:
a plurality of internal circuits each connected by one of a plurality of first interconnects to one of a plurality of circuit nodes;
a plurality of first bonding pads for providing operational test connections, each first bonding pad connected to one of the plurality of circuit nodes;
a plurality of second bonding pads, each connected to one of a plurality of second interconnects, wherein one or more of the plurality of second interconnects is connected to each of the plurality of circuit nodes;
a plurality of test circuits, each one connected to one of the plurality of second bonding pads,
wherein each test circuit tests the one of the plurality of second interconnects between the one of the plurality of second bonding pads to which it is connected and the one of the plurality of circuit nodes to which the one of the plurality of second interconnects is connected.

18. The semiconductor device according to claim 17, wherein the each of the plurality of test circuits comprises:
a level setting circuit connected to the one of the plurality of by one or more second interconnects bonding pads to which the test circuit is connected; and
a level detection circuit connected to the one of the plurality of first interconnects in a vicinity between the one of the plurality of circuit nodes to which the one of the plurality of by one or more second interconnects bonding pads is connected by the one of the plurality of second interconnects and the one of the plurality of internal circuits.

19. The semiconductor device according to claim 18, wherein the level setting circuit of each of the plurality of test circuits includes driving means for driving the first bonding pad with a signal at a high or low level.

20. The semiconductor device according to claim 19, wherein the level detection circuit of each of the plurality of test circuits includes a tri-state inverter for inverting a level of a signal transmitted by the corresponding level setting circuit through the corresponding one of the plurality of second interconnects and outputting a resultant signal,
wherein outputs of the tri-state inverters are connected to each other.

* * * * *